(12) United States Patent
Choi

(10) Patent No.: US 6,762,393 B2
(45) Date of Patent: Jul. 13, 2004

(54) INDUCTIVELY COUPLED PLASMA SOURCE WITH CONDUCTIVE LAYER AND PROCESS OF PLASMA GENERATION

(76) Inventor: Dae-Kyu Choi, #361-2 Shin-dong, Paldal-gu, Suwon-si, Kyounggi-do (KR)

( * ) Notice: Subject to any disclaimer, the term of this patent is extended or adjusted under 35 U.S.C. 154(b) by 0 days.

(21) Appl. No.: 10/291,869

(22) Filed: Nov. 12, 2002

(65) Prior Publication Data

US 2003/0089686 A1 May 15, 2003

(30) Foreign Application Priority Data

Nov. 9, 2001 (KR) .................................... 10-2001-69823

(51) Int. Cl.$^7$ ............................................... B23K 10/00
(52) U.S. Cl. ............................ 219/121.36; 219/121.43; 315/111.51; 156/345.48
(58) Field of Search ....................... 219/121.36, 121.43, 219/121.41, 121.48, 123; 204/298.37, 298.38; 315/111.51; 156/345.48, 345.35, 345.38; 118/723 MP, 723 E

(56) References Cited

U.S. PATENT DOCUMENTS

| | | | |
|---|---|---|---|
| 4,235,668 A | * 11/1980 | Bass et al. ..................... 176/3 |
| 4,392,918 A | * 7/1983 | Gaines ........................ 376/133 |
| 4,431,898 A | 2/1984 | Reinberg et al. |
| 5,811,022 A | 9/1998 | Savas et al. |
| 6,150,628 A | 11/2000 | Smith et al. |
| 6,388,226 B1 | 5/2002 | Smith et al. |
| 6,432,260 B1 | 8/2002 | Mahoney et al. |
| 6,468,388 B1 | 10/2002 | Hanawa et al. |

* cited by examiner

*Primary Examiner*—Mark Paschall
(74) *Attorney, Agent, or Firm*—Robert E. Bushnell, Esq.

(57) ABSTRACT

An inductively coupled plasma source may be constructed with a reactor including a gas inlet, a gas outlet, and a tube structure containing an electrically conductive layer with an open loop. The tube structure is disposed between two electrically non-conductive layers that form a continuous loop providing a discharge path. An A.C. power source supplies A.C. voltage to the conductive layer while a D.C. power source supplies a direct current voltage to the conductive layer. An inductor is electrically connected between the conductive layer and the D.C. power source and a capacitor is electrically connected between the conductive layer and the A.C. power source. The conductive layer is biased by the D.C. voltage applied by the D.C. voltage. Induction of a magnetic field is generated by the flow of current of conductive layer to which the A.C. voltage is supplied, and a secondary electric field is generated through the discharge path by means of the inducted magnetic field, thereby initiating a discharge of a plasma.

21 Claims, 9 Drawing Sheets

INDUCTIVELY COUPLED PLASMA SOURCE WITH CONDUCTIVE LAYER AND PROCESS OF PLASMA GENERATION

CLAIM OF PRIORITY

This application refers to, claims priority under 35 U.S.C. §119 and incorporates herein my patent application entitled Inductively Coupled Plasma Source filed in the Korean Industrial Property Office on the 9$^{th}$ day of November 2001 and there duly assigned Serial No. 2001-0069823, the contents of which are hereby incorporated by reference.

BACKGROUND OF THE INVENTION

1. Field of the Invention

The present invention relates generally to inductively coupled plasma sources and plasma generation, and more particularly, to an inductively coupled plasma source and process of plasma generation capable of preventing etching of the interior of a reactor due to sputtering of plasma gas.

2. Description of Related Art

Plasma sources are widely used in several processes during the manufacture of semiconductor devices, such as etching, stripping and cleaning of the devices. In processes that use plasma, the density and uniformity of the plasma generation affect the efficiency of the process. Consequently, several efforts have been made to increase the density and uniformity of plasma generation, and various proposals have been made for more effectively obtaining plasma. A high frequency power source must be used to obtain the plasma however, and this creates several problems that have long plagued the art.

A plasma source may be classified roughly into capacitively coupled plasma and inductively coupled plasma according to the particular principle of plasma generation. A plasma source using the inductively coupled plasma is described in U.S. Pat. No. 4,431,898 entitled *Inductively Coupled Discharge For Plasma Etching and Resist Stripping*, granted to Alan R. Reinberg on the 14$^{th}$ day of February 1984 (hereinafter called Reinberg '898). In this patent, Alan R. Reinberg proposes an inductively coupled plasma source that uses a plasma chamber having a toroidal tube structure to which an A.C. (alternating current) power source is supplied. The tube structure acts as both primary and secondary windings. A transformer core transmits the energy from the primary winding to the secondary winding.

Since the aforementioned plasma source proposed by Reinberg '898 uses a transformer with complex turns, the efficiency of the energy transmission is very low. As a result, the efficiency of ionization is also low and the plasma is liable to be extinguished. A supply of high energy is necessary in order to stabilize generation of the plasma. In this case, a high frequency power source, which is very expensive, must be used. Consequently, a high initial cost as an investment in the facility is required. Moreover, the inner wall of the plasma chamber with a toroidal tube structure is etched by the collision of the ions in the plasma. I have discovered that there is a need for some solution to prevent etching of the plasma reactor.

SUMMARY OF THE INVENTION

The present invention is disclosed in order to overcome the aforesaid drawbacks of the prior art.

It is therefore, one object of the present invention to provide an improved plasma generating process and source.

It is another object to provide an inductively coupled plasma source capable of increasing efficiency of generation of the plasma.

It is yet another object to provide a more efficient plasma generating process and inductively coupled source.

It is still another object to provide a plasma generating process and inductively coupled source that minimizes the etching of the plasma reactor.

It is still yet another object of the present invention to provide a plasma generating process and an inductively coupled plasma source capable of preventing etching of the inner wall of the plasma reactor due to collisions of the ions in plasma form.

According to one aspect of the present invention, to accomplish the objects of the invention as mentioned above, a plasma generating process and an inductively coupled plasma source may be constructed with a reactor including a gas inlet, a gas outlet, and a tube structure that has a conductive layer with a open loop. The tube structure is disposed between two non-conductive layers having a continuous loop providing a discharge path. An A.C. power source supplies A.C. voltage to the conductive layer. A magnetic field is induced by the flow of alternating current through the conductive layer to which the A.C. voltage is supplied, and a secondary electric field is generated through the discharge path by the inducted magnetic field, which, in turn, causes the occurrence of plasma discharge.

In the practice of the present invention, the inductively coupled plasma source may use at least one transformer core disposed in the tube structure to reinforce the inducted magnetic field.

In an alternative embodiment of the present invention, the inductively coupled plasma source may be constructed with a D.C. power source for supplying D.C. voltage to the conductive layer, and an inductor electrically may be connected between the conductive layer and the D.C. power source. A condenser may be electrically connected between the conductive layer and the A.C. power source, so that the conductive layer is coupled to the A.C. power source, and is thus supplied with a positive voltage biased by means of the D.C. voltage applied by the D.C. voltage.

In the practice of the present invention, the conductive layer may be tubular or coil-shaped.

Various modifications and changes of the present invention may be made to these embodiments in accordance with the principles of the invention, and it is to be distinctly understood that the scope of invention is not limited to the embodiments as mentioned below. It should be noted that the embodiments of the present invention are provided to explain the invention more clearly to those who have ordinary skill in the art. Therefore, shape or the like of the elements in the drawings is exaggerated for the purpose of more clear and accurate explanation.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE EMBODIMENTS

Figure 1:
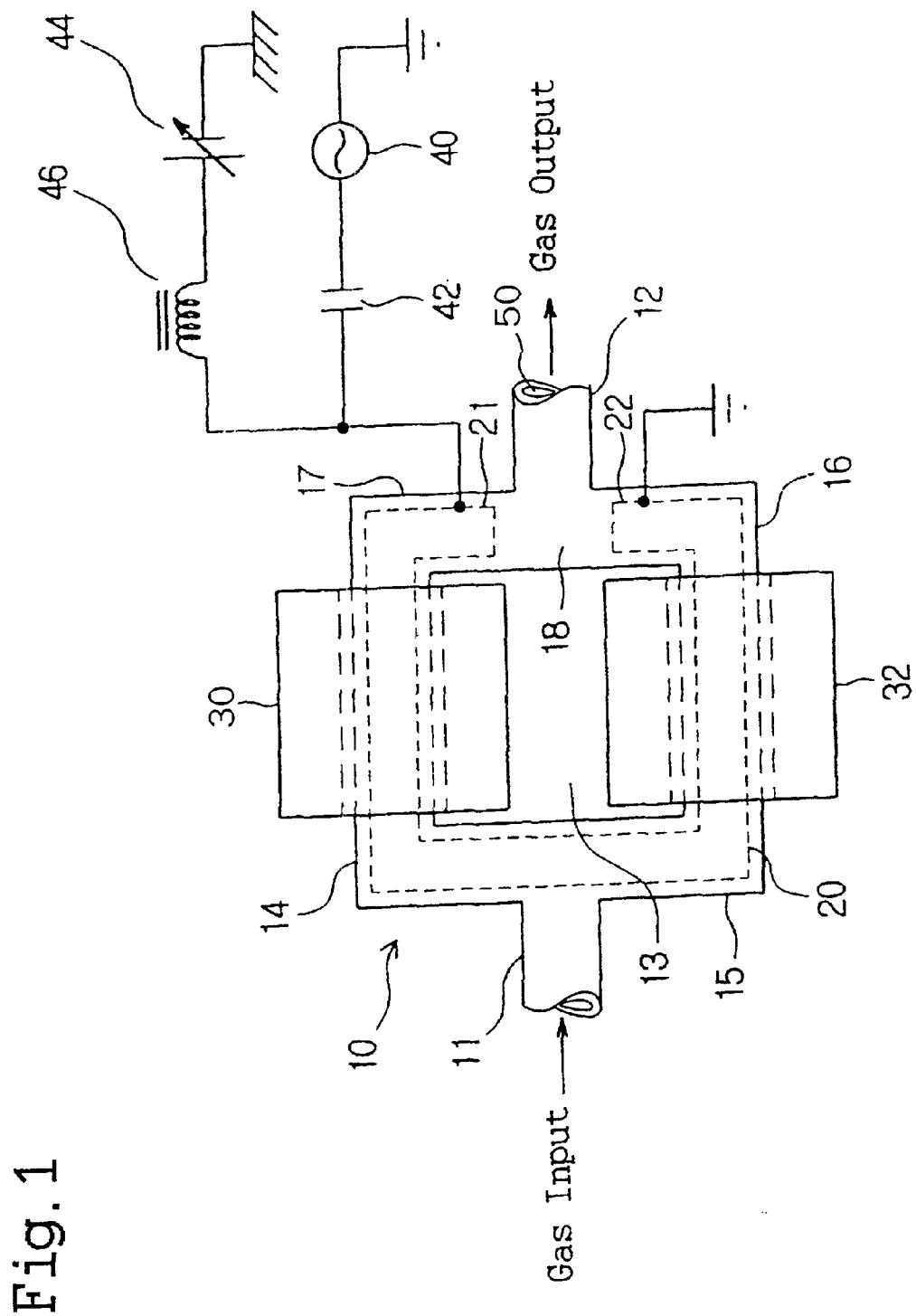
FIG. 1 is a schematic diagram illustrating the structure of an inductively coupled plasma source constructed according to the principles of the present invention.

Turning now to the drawings, FIG. 1 is an illustrational view of a tube structure 10 for an inductively coupled plasma reactor constructed as an illustrative embodiment according to the principles of the present invention. Tube structure 10 may be made of pyrex or any similar non-electrically conductive material such as glass, ceramic, TEFLON, or heat resistant plastic.

Tube structure 10 may be constructed with a gas inlet 11 axially opposite from a gas outlet 12. Gas inlet 11 is connected to a process source of gas (not shown) while gas outlet 12 is connected to a process chamber (not shown) or to a vacuum pump (not shown). Tube structure 10 may be constructed with four legs 14, 15, 16 and 17 which form a continuous path through lumen 50 around a central opening 13 located between and transverse to the axes of gas inlet 11 and gas outlet 12.

Figure 2:
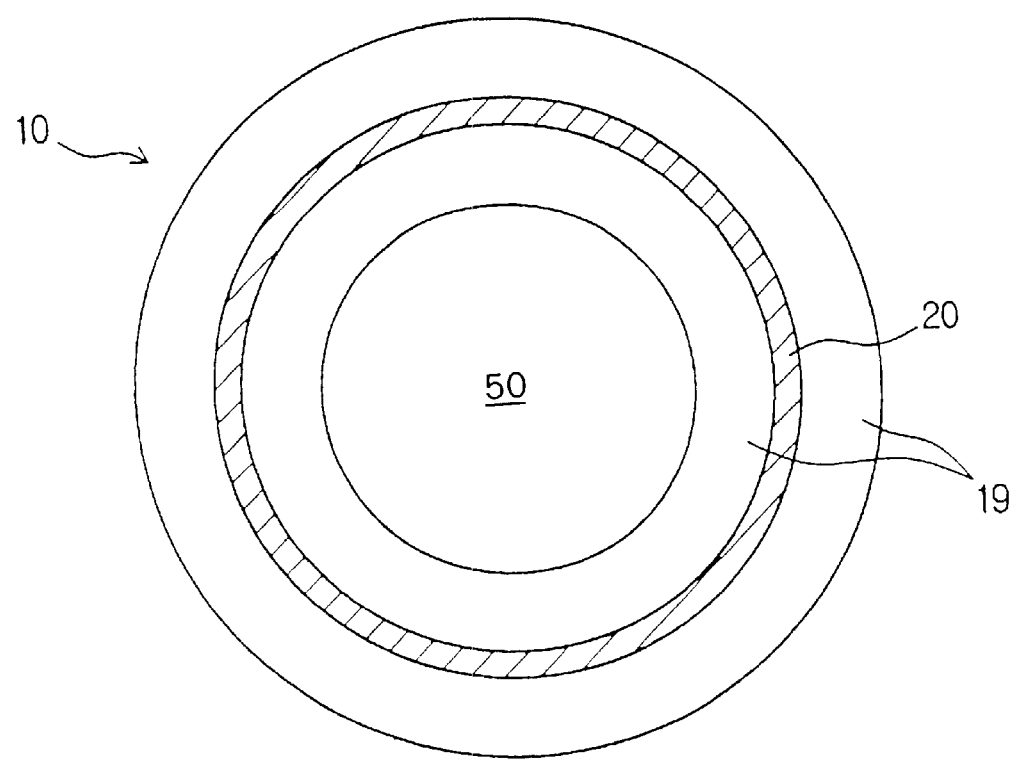
FIG. 2 is a cross sectional view showing a single conductive layer disposed inside the tube structure illustrated by FIG. 1.
Figure 3:
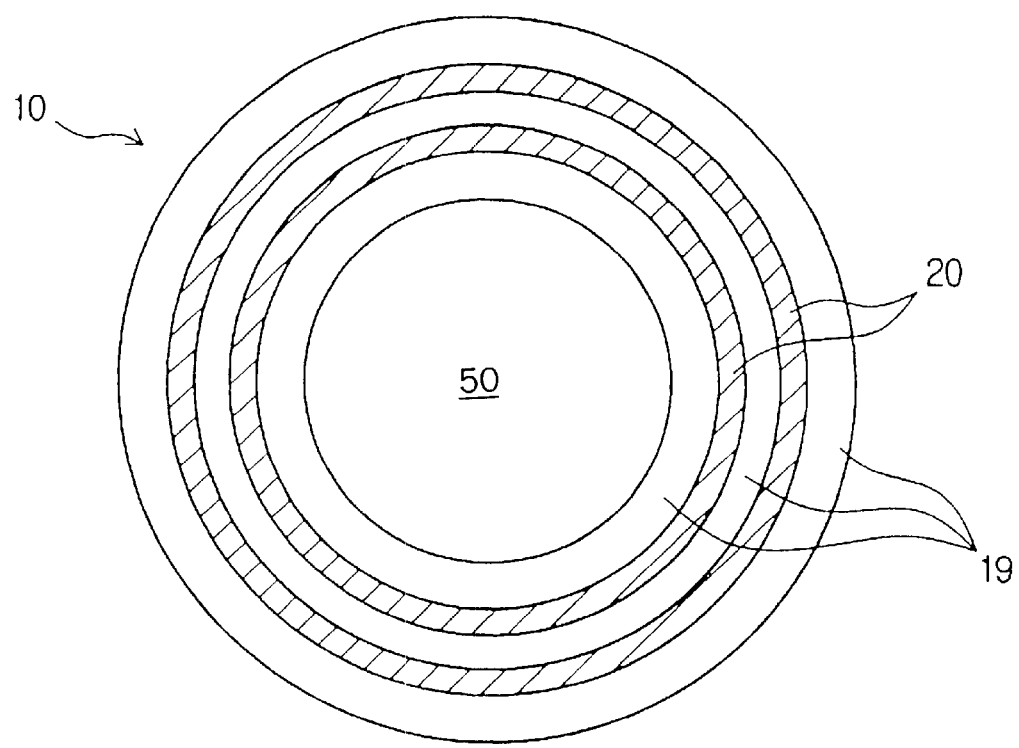
FIG. 3 is a cross sectional view showing two conductive layers disposed inside the tube structure illustrated by FIG. 1.

Referring now collectively to FIGS. 1 through 3, FIG. 2 and FIG. 3 show cross sections of tube structure 10 respectively. As shown in the drawings, tube structure 10 includes two non-electrically conductive layers 19 in the form of a cylindrical pipe and one, or alternatively, two electrically conductive layers 20. Electrically conductive layer 20 is disposed in the form of a C-shape open loop along tube structure 10. Insulating member 18 is arranged at the position where the electrically conducting loop is open.

Disposed through opening 13 and encircling first leg 14 and the third leg 16 of tube structure 10 are transformer cores 30, 32. Transformer cores 30, 32 maybe made of magnetic material such as ferrite or similar magnetically permeable material. The tube structure 10 constructed as described above acts as a single winding transformer. Conductive layer 20 has one end 21 electrically connected to A.C. power source 40 via capacitor 42. The other end 22 of the conductive layer 20 is electrically coupled to a local reference potential, such as a ground connection. The same end 21 of the conductive layer 20, which is connected to the condenser 42, may be connected to a D.C. (direct current) power source 44 via at inductor 46. A.C. power source supplies high voltage at high frequency while the D.C. power source 44 is a variable power source capable of supplying a variable bias voltage to conductive layer 20. The polarity of the D.C. power source is also variable. That is to say, positively or negatively biased voltage may be supplied to conductor 20 by direct current source 44. Capacitor 42 filters the direct current supplied from direct current power source 44 from being applied to alternating current source 40 while inductor 46 blocks alternating current supplied from A.C. power source 40 from being applied to direct current power source 44.

The operating principle by which the plasma discharge occurs with the inductively coupled plasma apparatus constructed as mentioned above is described in greater detail by the following paragraphs.

Figure 4:
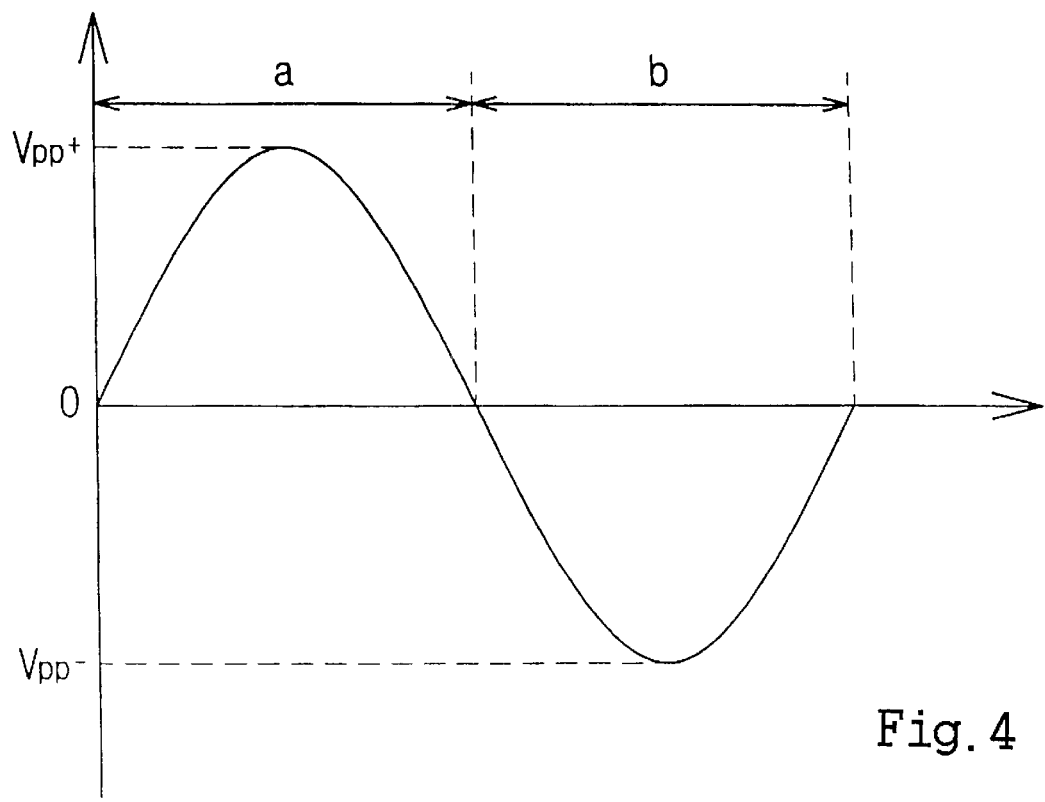
FIG. 4 is a two coordinate graph showing a waveform of one cycle for an A.C. voltage generated from a source of A.C. power as a function of time.

FIG. 4 is a two coordinate graph showing one cycle of an alternating voltage waveform generated by A.C. power source 40. As shown in the drawing, the alternating voltage output from A.C. power source 40 has a maximum amplitude at voltage Vpp+, a minimum amplitude at voltage Vpp−, and a prescribed frequency. When the A.C. voltage is applied from A.C. power source 40 to conductive layer 20, a magnetic field is induced by the varying magnitude of the alternating current flowing through conductive layer 20, and then a secondary electric field is created by the induced magnetic field.

The induced secondary electric field established by a closed path along the continuous loop formed by first through fourth legs 14, 15, 16, 17 of tube structure 10. The induced secondary electric field varies in dependence upon the frequency of A.C. power source 40. At this time, gas molecules in the closed path of the tube structure 10 are accelerated in dependence upon the change in the secondary electric field, and collisions occurring between the gas molecules initiate plasma discharge. On the other hand, when the plasma discharge occurs, ionized gas ion particles inside lumen 50 strike against the inner walls of tube structure 10.

Figure 5A:
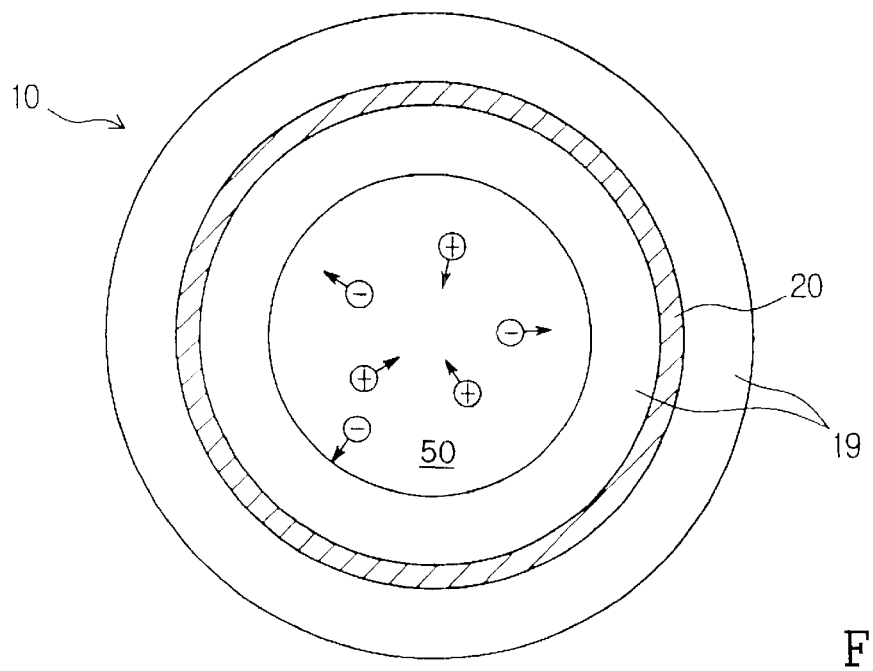
FIG. 5a and FIG. 5b are cross-sectional views explaining the directions of movement of ion particles in the circular pipe of the tube structure.
Figure 5B:
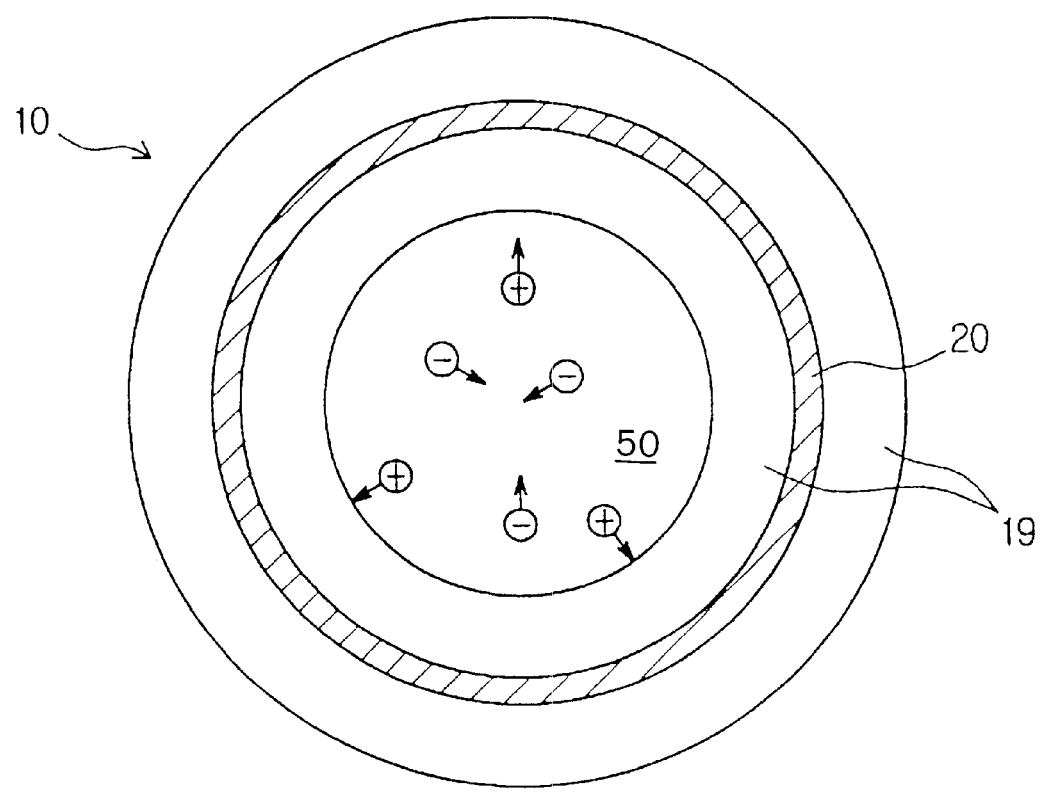

FIG. 5a and FIG. 5b are views explaining the directions of movement of the ion particles inside circular pipe formed by lumen 50 of tube structure 10. FIG. 5a shows that electrons which bear negative charges are drawn outwardly when a positive voltage is applied to conductive layer 20, while FIG. 5b shows that positive ions are forced outward when a negative voltage is applied to conductive layer 20.

Referring again to FIG. 4, the A.C. voltage is supplied from A.C. power source 40 to the conductive layer 20 disposed in tube structure 10 to coaxially surround circular pipe 50, the positive voltage and the negative voltage are applied alternately in successive cycles to electrically conductive layer 20. When the voltage applied from A.C. power source 40 to electrically conductive layer 20 is in the half cycle, "a" is exhibiting a positive voltage amplitude, the negatively charged electrons among the gas ion particles are forced outwardly. Since the mass of an electron is very small, there is no risk that the inner wall of the tube structure will be damaged. In the half cycle "b" is exhibiting a negative voltage amplitude however, the positive ions among the gas ion particles are forced outward. The positive ions forced outward strike so strongly against the inner wall of circular pipe 50, that the inner wall of tube structure 10 may be etched.

Figure 6:
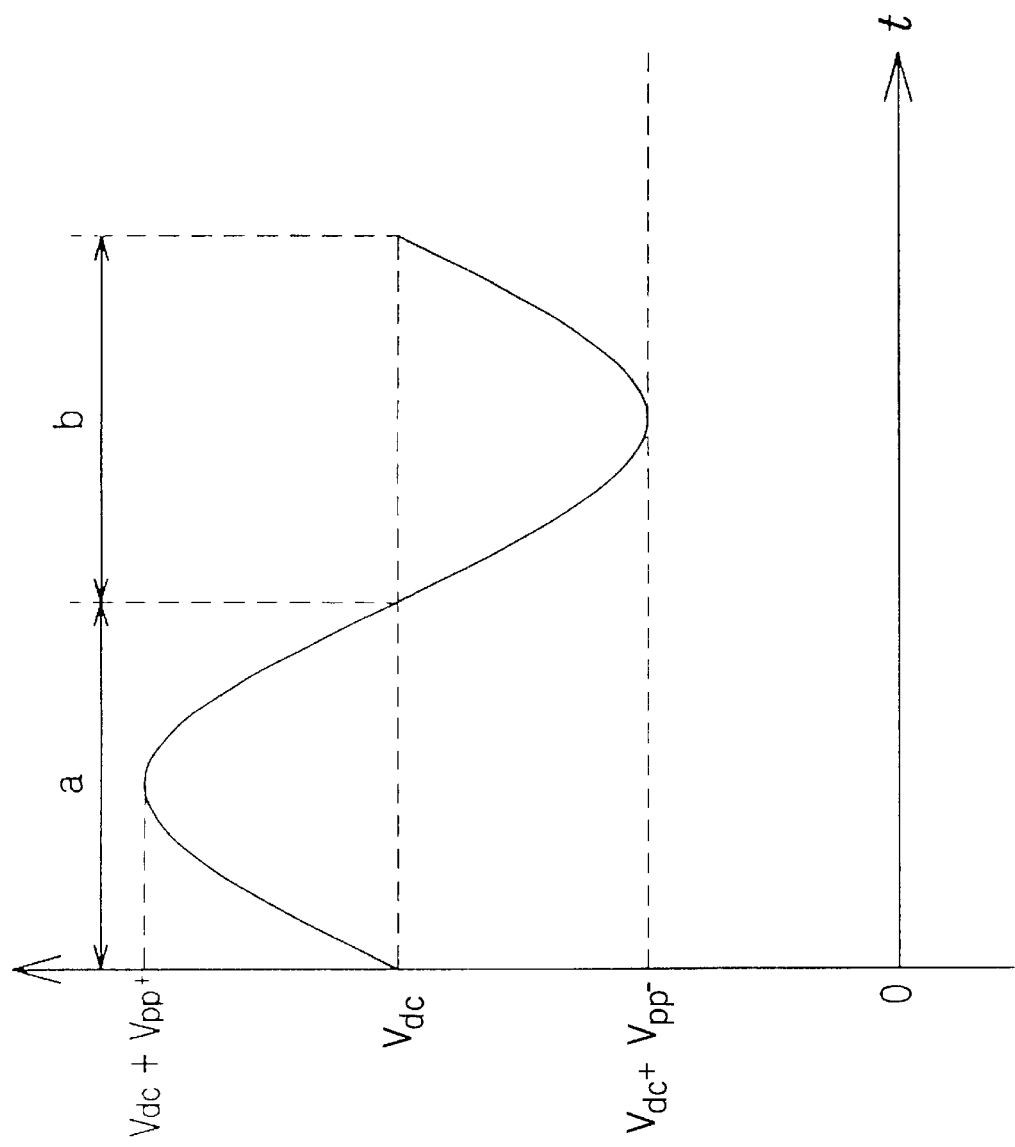
FIG. 6 is a two coordinate graph showing a waveform of one cycle for an A.C. voltage biased by a direct current voltage, applied to the conductive layer as a function of time.

Turning now to FIG. 6, in order to avoid this occurrence of etching, a positive bias voltage maybe applied from D.C. power source 44 to conductive layer 20. FIG. 6 is a two coordinate graph showing a waveform of the biased A.C. voltage applied to the conductive layer 20. By setting the amplitude of $V_{dc}$ to a positive value greater than the maximum zero-to-peak amplitude of the. alternating current waveform, that is, with the amplitude of $V_{dc}$ set to maintain a constant polarity (e.g., in order to maintain a single polarity applied across conductive layer 20:

$$V_{dc} \geq |V_{pp}|, \quad (1)$$

then, the minimum voltage applied collectively by alternating current source 40 and direct current battery 44, to electrically conductive layer 20 is either zero or greater, and is never negative in polarity. If $V_{dc}$ is set so that:

$$V_{dc} > |V_{pp}| \quad (2)$$

then, as illustrated by FIG. 6, the minimum voltage collectively applied to conductive layer 20 will always be greater than zero; and consequently, the minimum voltage Vpp- of the biased A.C. voltage applied to the conductive layer 20 is D.C. voltage $V_{dc}+V_{pp}$ with the electrical current flowing through conductor 20 maintaining a positive polarity.

Figure 7:
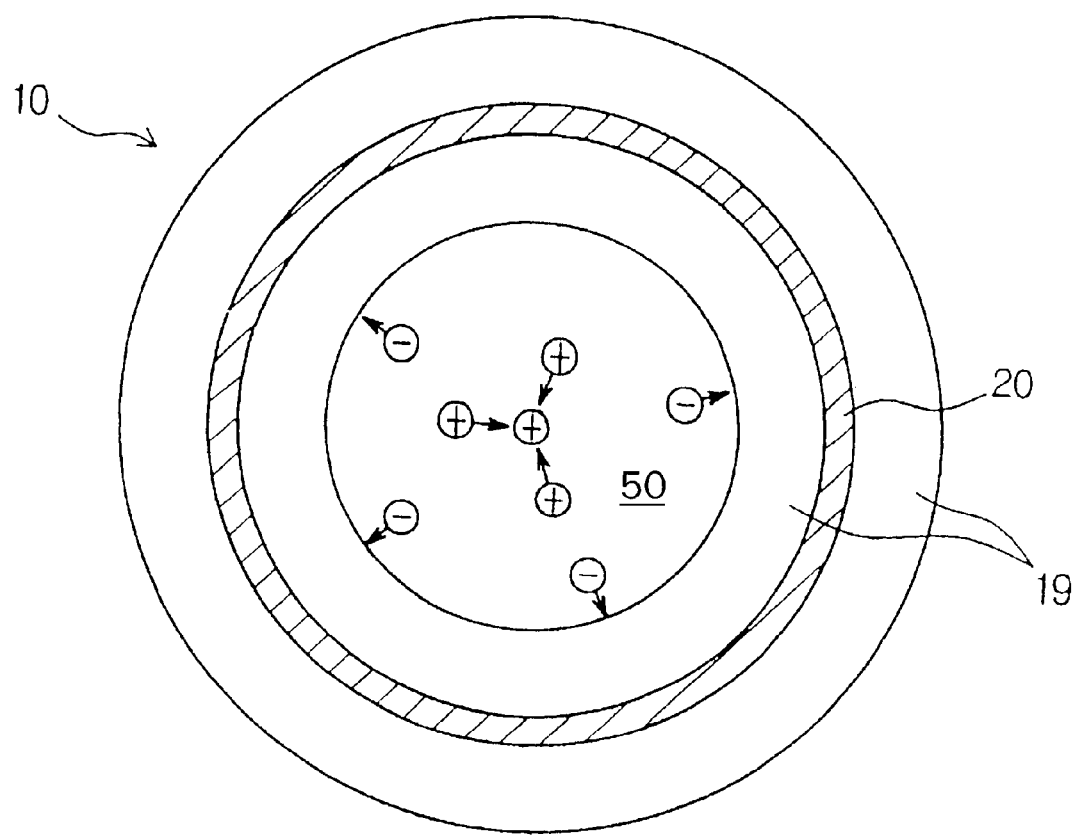
FIG. 7 is a view showing the state of distribution of the ion particles in the circular pipe of the tube structure.

Consequently, as shown in FIG. 7, the heavier, more massive positive ions among the ion particles in plasma form in the closed path formed by lumen 50 extending through first, second, third and fourth legs 14, 15, 16, 17 of tube structure 10 are forced toward the center of lumen 50. As a result, there is little possibility that the positive ions strike against the inner wall of tube structure 10. Therefore, it is possible to prevent the inner wall of the tube structure from erosion due to the etching caused by the positive ions striking against the walls of circular pipe 50.

Figure 8:
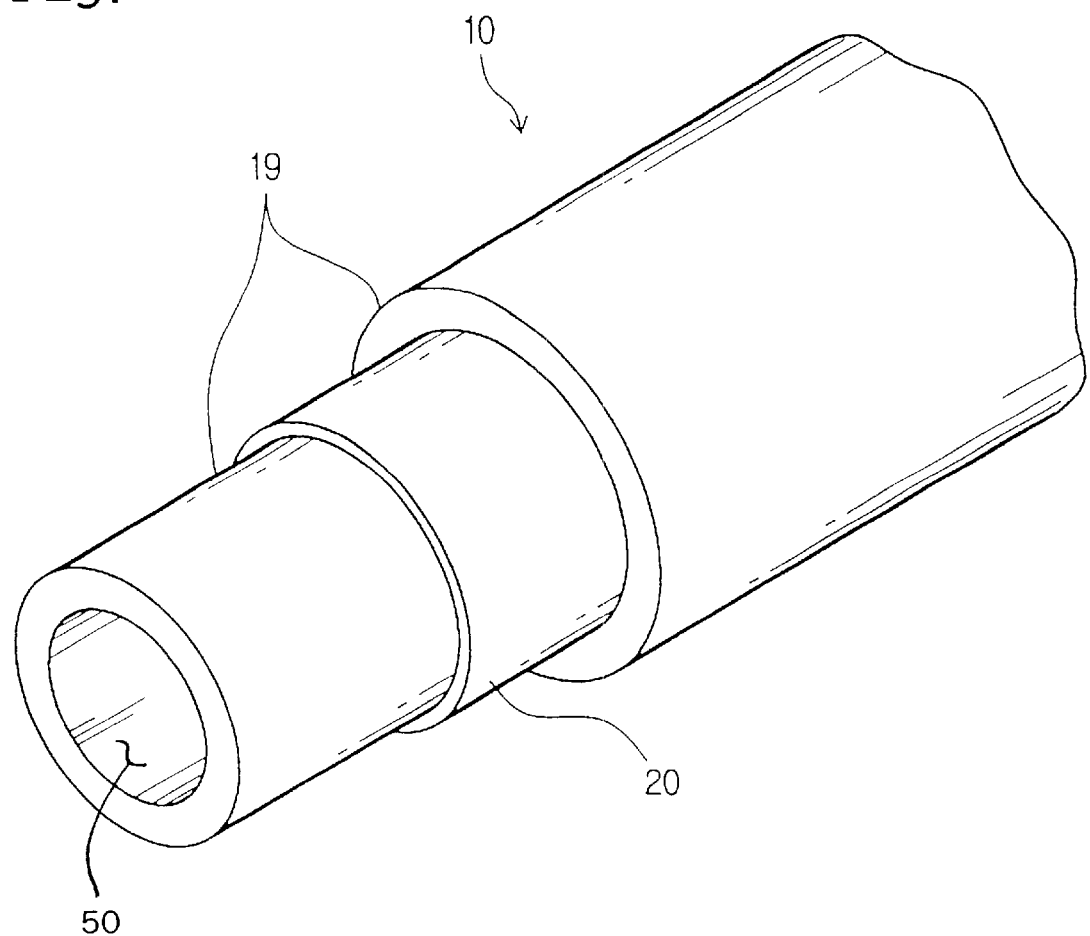
FIG. 8 and FIG. 9 are partially cutaway perspective views of alternative embodiments of the present invention with different implementations of the conductive layer applied to the tube structure.
Figure 9:
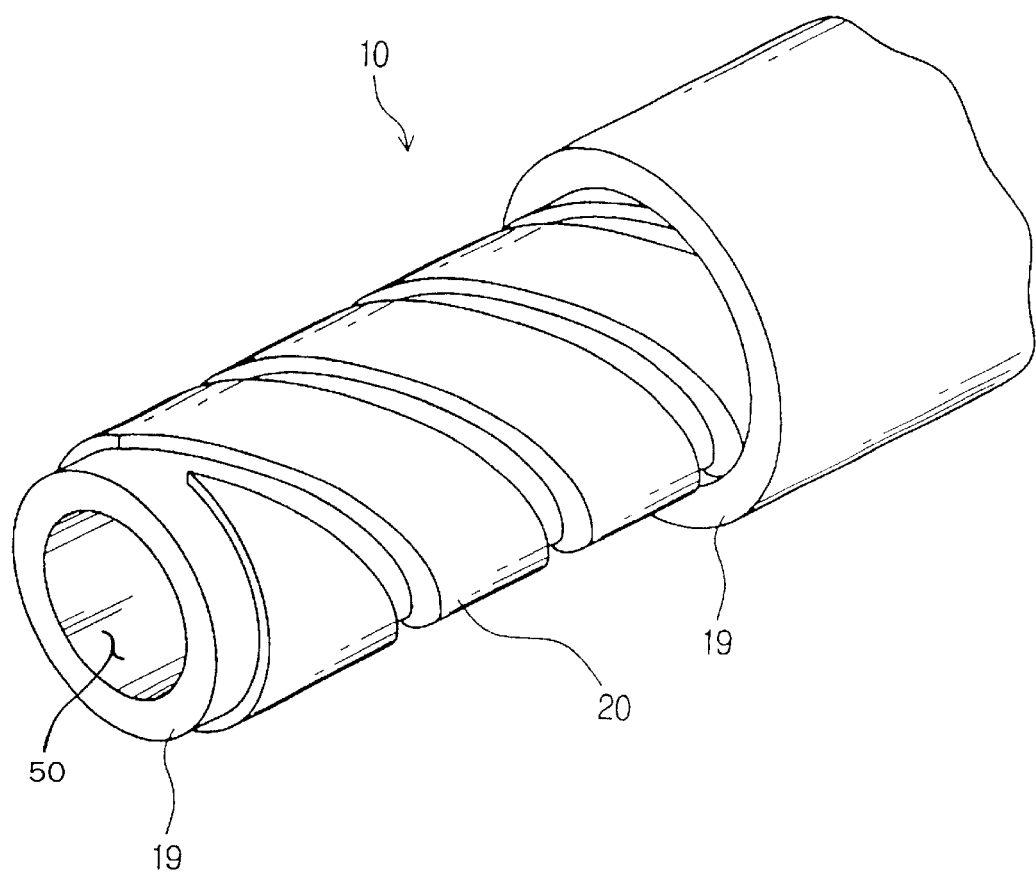

FIG. 8 and FIG. 9 are partially cutaway perspective views of different alternative embodiments of conductive layer 20 applied to tube structure 10. As mentioned above, tube structure 20 may be constructed with a coaxial arrangement of non-conductive layers 19 and conductive layers 20. Conductive layer 20 may be formed as a simple circular pipe providing a central lumen 50 as shown in FIG. 8, or the conductive layer 20 may be formed in a helically coiled shape as is shown by FIG. 9. In case that the conductive layer 20 is formed in the coiled shape illustrated by FIG. 9, one magnetic field due to the entire current flow and another magnetic field induced by the coiled shape cross each other when the A.C. voltage is applied from the A.C. power source 40 to the conductive layer 20, and thus a complex magnetic field is induced. Consequently, a secondary electric field induced by the compositively induced magnetic field is also induced compositively. In this way, the induced secondary electric field makes the gas molecules in the closed path formed by first through fourth legs 14, 15, 16, 17 of tube structure 10 accelerate more effectively. As a result, the probability of the collision among the gas molecules becomes higher, and thus the plasma discharge can be accomplished more effectively.

Although illustrative embodiments demonstrating the construction and operation of inductively coupled plasma according to the principles of the present invention has been described herein and shown in the drawings, these descriptions and drawings are merely for illustrative purposes only, and it is to be understood that various changes or modifications will be apparent to those skilled in the art without departing from the spirit of the invention.

According to the present invention as fully described above, the efficiency of the energy transmission of the inductively coupled plasma source is increased, and the plasma discharge can be accomplished more effectively. Furthermore, it is possible to prevent the inner wall of the tube structure from being etched due to the positive ions hitting against the wall.

What is claimed is:

1. An inductively coupled plasma source, comprising:

a reactor including a gas inlet, a gas outlet, and a tube structure having a conductive layer with an open loop, the tube structure being disposed between two non-conductive layers having a continuous loop providing a discharge path; and a first power source applying alternating voltage to the conductive layer, with induction of a magnetic field being generated by the flow of current through said conductive layer to which the alternating current voltage is applied, and a secondary electric field being generated through the discharge path by means of the inducted magnetic field, accommodating a triggering occurrence of plasma discharge.

2. The inductively coupled plasma source of claim 1, further comprising at least, one transformer core disposed in said tube structure reinforcing the inducted magnetic field.

3. An inductively coupled plasma source, comprising:

a reactor including a gas inlet, a gas outlet, and a tube structure having a conductive layer with an open loop, the tube structure being disposed between two non-conductive layers having a continuous loop providing a discharge path;

a first power source applying alternating voltage to the conductive layer, with induction of a magnetic field being generated by the flow of current through said conductive layer to which the alternating current voltage is applied, and a secondary electric field being generated through the discharge path by means of the inducted magnetic field, accommodating a triggering occurrence of plasma discharge;

a direct current power source supplying direct current voltage to said conductive layer;

an inductor electrically connected between said conductive layer and the direct current power source; and a capacitor electrically connected between the conductive layer and said first power source, with said direct current power source biasing said conductive layer to continuously exhibit a positive voltage while said first power source applies said alternating voltage to said conductive layer.

4. The inductively coupled plasma source of claim 1, further comprised of said conductive layer being tubular.

5. The inductively coupled plasma source of claim 1, further comprised of said conductive layer being wound in a helical coil.

6. The inductively coupled plasma source of claim 1, further comprising a direct current power source supplying direct current voltage to said conductive layer.

7. The inductively coupled plasma source of claim 1, further comprising a direct current power source biasing said conductive layer to continuously exhibit a positive voltage while said first power source applies said alternating voltage to said conductive layer.

8. The inductively coupled plasma source of claim 1, further comprised of said conductive layer being disposed in the form of a C-shape open loop along said tube structure and an insulating member being arranged at the position where the electrically conducting loop is open.

9. An inductively coupled plasma source, comprising:

a reactor comprised of an inlet port separated by an intermediate tube structure from an outlet port, accommodating passage of a gaseous phase of a fluid;

an electrically conductive layer forming a continuous loop providing a discharge path; and a power source generating a secondary electrical field through said discharge path with a magnetic field created in response to a flow of electrical current through said conductive layer during application by said power source of an electrical potential varying in magnitude across said conductive layer.

10. The inductively coupled plasma source of claim 9, further comprised of said conductive layer aligning said discharge path with said gas outlet.

11. An inductively coupled plasma source, comprising:
a reactor comprised of an inlet port separated by an intermediate tube structure from an outlet port, accommodating passage of a gaseous phase of a fluid:
an electrically conductive layer forming a continuous loon providing a discharge path; and
a power source generating a secondary electrical field through said discharge path with a magnetic field created in response to a flow of electrical current through said conductive layer during application by said power source of an electrical potential varying in magnitude across said conductive layer,
with said power source maintaining said magnitude at a single constant polarity.

12. An inductively coupled plasma source, comprising:
a reactor comprised of an inlet port separated by an intermediate tube structure from an outlet port, accommodating passage of a gaseous phase of a fluid;
an electrically conductive layer forming a continuous loop providing a discharge path; and
a power source generating a secondary electrical field through said discharge path with a magnetic field created in response to a flow of electrical current through said conductive layer during application by said power source of an electrical potential varying in magnitude across said conductive layer,
with said power source superimposing said electrical potential upon a constant voltage exhibiting a magnitude that is not less than a maximum zero-to-peak voltage of said electrical potential.

13. The inductively coupled plasma source of claim 9, further comprised of said conductive layer being tubular.

14. The inductively coupled plasma source of claim 9, further comprised of:
said intermediate tube structure providing a lumen extending between said inlet port and said outlet port while accommodating said passage; and
said conductive layer coaxially surrounding said lumen.

15. The inductively coupled plasma source of claim 9, further comprised of:
said intermediate tube structure having a plurality of interconnected legs extending between said inlet port and said outlet port while providing parallel lumina accommodating alternate routes for said passage; and
said conductive layer coaxially surrounding a plurality of said lumina.

16. The inductively coupled plasma source of claim 9, further comprised of:
said intermediate tube structure having a plurality of interconnected legs extending between said inlet port and said outlet port while providing a plurality of lumina accommodating alternate routes for said passage;
said conductive layer coaxially surrounding a plurality of said lumina coextensive with said loop; and
said power source applying said electrical potential across opposite extremities of said loop.

17. The inductively coupled plasma source of claim 9, further comprised of:
said intermediate tube structure having a plurality of interconnected legs extending between said inlet port and said outlet port while providing a plurality of lumina accommodating alternate routes for said passage;
said conductive layer comprising a helical spiral of an electrically conductive material coaxially surrounding a plurality of said lumina coextensive with said loop; and
said power source applying said electrical potential across opposite extremities of said loop.

18. A method of an inductively coupled plasma source, comprising:
disposing a conductive layer with an open loop in a tube structure, the tube structure being disposed between two non-conductive layers having a continuous loop providing a discharge path in a reactor including a gas inlet and a gas outlet;
applying alternating voltage to the conductive layer by a first power source; and
generating induction of a magnetic field by the flow of current through said conductive layer to which the alternating current voltage is applied, and a secondary electric field being generated through the discharge path by the inducted magnetic field, accommodating a triggering occurrence of plasma discharge.

19. The method of claim 18, further comprising of supplying direct current voltage to said conductive layer.

20. The method of claim 18, further comprising of biasing said conductive layer by a direct current power source to continuously exhibit a positive voltage while said first power source applies said alternating voltage to said conductive layer.

21. The method of claim 18, further comprising of supplying the walls of said tube structure with a direct current bias.

* * * * *